United States Patent [19]

Stajcer

[11] Patent Number: 4,818,956
[45] Date of Patent: Apr. 4, 1989

[54] DIELECTRICALLY STABILIZED GAAS FET OSCILLATOR WITH TWO POWER OUTPUT TERMINALS

[75] Inventor: Antun Stajcer, Kitchener, Canada
[73] Assignee: Com Dev Ltd., Cambridge, Canada
[21] Appl. No.: 83,567
[22] Filed: Aug. 3, 1987
[30] Foreign Application Priority Data
  May 5, 1987 [CA] Canada .................................... 536392
[51] Int. Cl.[4] ............................................... H03B 5/38
[52] U.S. Cl. .................................. 331/96; 331/107 SL
[58] Field of Search ............ 331/96, 107 DP, 107 SL, 331/116 R, 116 FE, 116 M

[56] References Cited
U.S. PATENT DOCUMENTS
  4,484,156 11/1984 Khanna et al. .................... 331/96 X
  4,591,806 5/1986 Havens ..................... 331/107 DP X Primary Examiner—Eugene R. LaRoche
Assistant Examiner—Robert J. Pascal
Attorney, Agent, or Firm—Daryl W. Schnurr

[57] ABSTRACT

A dielectrically stabilized planar GaAs FET oscillator has a single gate transistor with a gate terminal and a drain terminal. A cylindrically shaped dielectric resonator is mounted on a ceramic support. The dielectric resonator resonates in a $TE_{01}$ mode and is located on the gate line of the transistor a predetermined distance from the gate terminal. The transistor is biased so that the dielectric resonator alone can stabilize the power produced by the transistor. Stabilized output power is obtained from both the drain terminal and the gate terminal. With previous oscillators having a single gate transistor, output power could only be obtained from one terminal.

11 Claims, 4 Drawing Sheets

DIELECTRICALLY STABILIZED GAAS FET OSCILLATOR WITH TWO POWER OUTPUT TERMINALS

BACKGROUND OF THE INVENTION

1. Field of the Invention

This invention relates to a dielectrically stabilized oscillator consisting of a single gate Gallium Arsenide Field Effect Transistor (henceforth referred to as GaAs FET) oscillator stabilized by a dielectric resonator. The oscillator has a single gate transistor with drain and gate output ports that can simultaneously provide output power.

2. Description of the Prior Art

GaAs FET oscillators that are stabilized with dielectric resonators are known. However, previous oscillators provide only one source of output power, usually from the drain terminal. The gate terminal is used to stabilize the power in the oscillator.

SUMMARY OF THE INVENTION

It is an object of the present invention to provide a dielectrically stabilized planar GaAs FET oscillator that can be made to produce power simultaneously from two output ports while displaying good thermal stability and low phase noise.

A dielectrically stabilized planar GaAs FET oscillator has a housing containing a metal pattern on a dielectric substrate with backside metalization soldered to a carrier. The housing has a single gate transistor mounted therein. The transistor has a gate terminal and a drain terminal with dielectric material located on a gate line of said transistor. The metal pattern is formed and the transistor is biased. Only the dielectric material is required to stabilize power at the frequency of interest. Both terminals of said transistor can be made to supply microwave power simultaneously, while said dielectric material resonates in a $TE_{01}$ mode. A power supply to the oscillator is a single negative supply voltage, the output power at the drain terminal being greater than the output power at the gate terminal.

DESCRIPTION OF A PREFERRED EMBODIMENT

Figure 1:
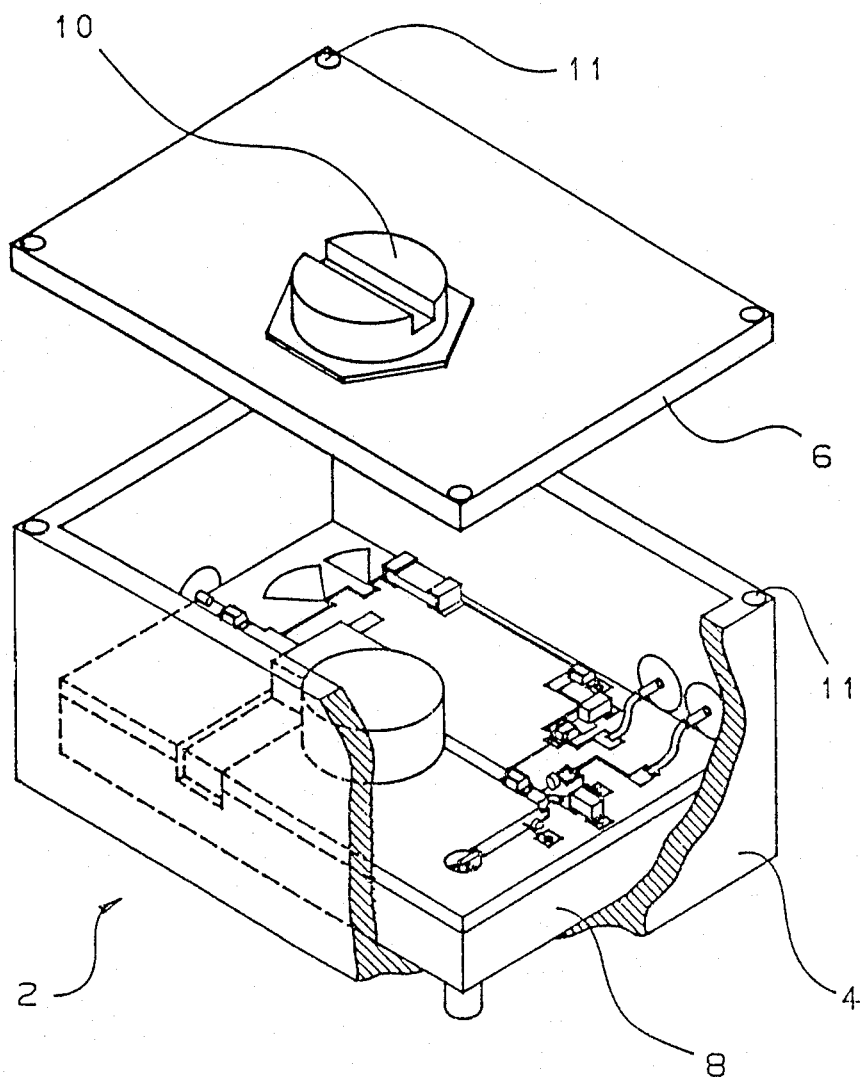
FIG. 1 is a partial perspective view of an oscillator with a cover in an open position and part of a housing removed for ease of illustration.

Referring to the drawings in greater detail, in FIG. 1, the planar oscillator 2 has a housing 4 with a cover 6 that is shown in an open position. The housing 4 contains a metal pattern on a dielectric substrate with backside metalization soldered to a metal carrier 8. The cover 6 has an adjustable metallic plunger 10. The carrier 8 acts as a ground plane for the oscillator 2. When the cover 6 is in a closed position on the housing 4, it is held in place by screws (not shown) inserted into openings 11.

Figure 2:
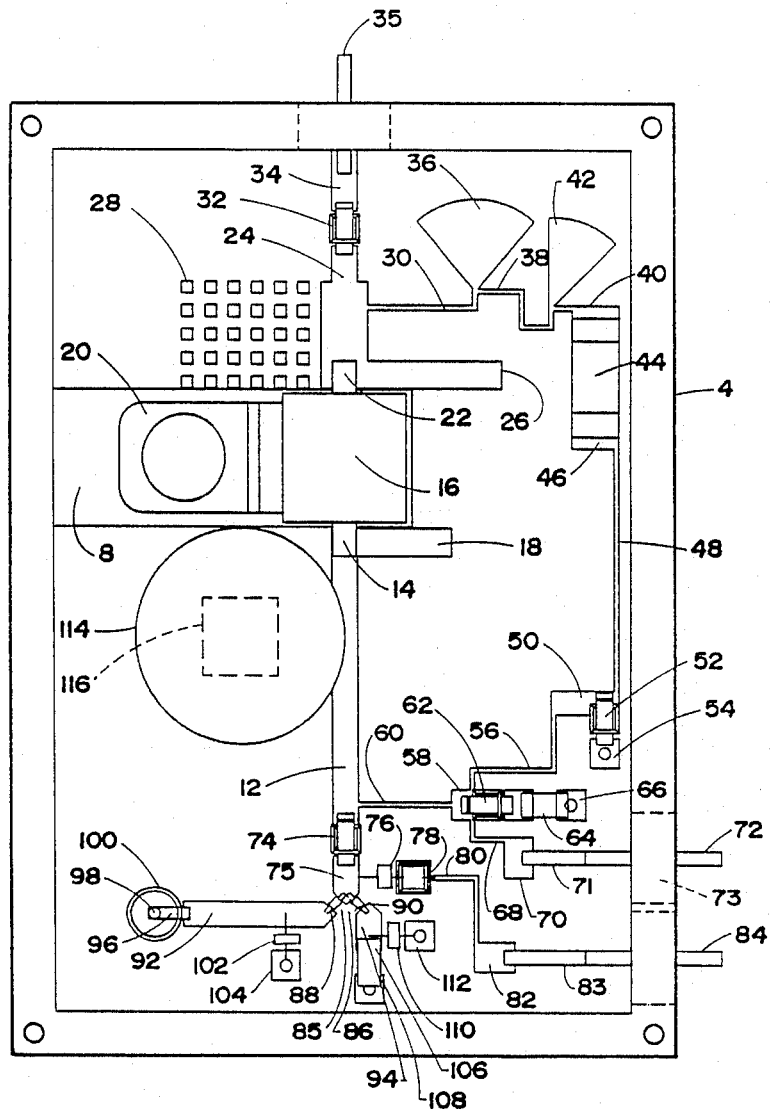
FIG. 2 is a top view of the oscillator of FIG. 1 with the cover removed.

The FIG. 2, it can be seen that the metal pattern consists of a microstripline 12 which is connected to a gate tab 14 of a FET 16 with solder (not shown). An open circuit metal stub 18 is an integral part of the microstripline 12. The transistor 16 has a source 20 soldered to the carrier 8. A drain tab 22 is soldered to an output circuit comprised of metalization 24 having a stub 26 integral therewith. A plurality of tuning pads 28 are located adjacent to the metalization 24.

A high impedance microstripline 30 of a fixed length is attached to the metalization 24 at a predetermined distance from the drain tab 22. Metalization 24 ends in a blocking capacitor 32, which is connected in series to a drain output microstripline 34. The microstripline 34 is in turn connected to the outlet 35. Thus, the outlet 35 is the outlet for the power output from the drain terminal 22. A microstrip fan 36 of predetermined angle and radius is attached to an end of the microstripline 30 opposite to the metalization 24. A high impedance microstripline 38 extends from the microstripline 30 at the fan 36 to a microstrip pad 40. A fan 42 is attached to the microstripline 38 near the pad 40. The fan 42 has the same or similar size and shape as the fan 36. A bias resistor 44 is attached to the tuning pad 40 and extends from the pad 40 to microstrip pad 46.

A high impedance microstripline 48 extends from the pad 46 to a microstrip pad 50. A capacitor 52 is connected in series from pad 50 to ground (i.e. carrier 8) by a plated through via-hole 54. A plated through via-hole has a hole with edges (not shown) of the hole being plated to connect with the ground.

Microstripline 56 extends from the pad 50 to microstrip pad 58. A high impedance microstripline 60 extends from the pad 58 to the gate microstripline 12. A capacitor 62 is connected from the pad 58 in series to a 50 ohm transistor 64 and then to the ground plane 8 through plated via-hole 66. A microstripline 68 extends from the microstrip pad 58 to a bias pad 70. A 10 mil ribbon 71 connects the bias pad 70 to a center pin 72 of a hermetically sealed feed through. The oscillator voltage is fed into the oscillator through a filter cone 73. Thus, the center pin 72 is the power input to the oscillator.

The microstripline 12 is terminated at an end opposite to the gate tab 14 by a blocking capacitor 74 connected in series to a section of 50 ohm microstripline 75. A coil 76 is connected between the 50 ohm line 75 and a top plate (not shown) of a capacitor 78. A microstripline 80 extends from the top plate of the capacitor 78 to a bias pad 82. A 10 mil ribbon 83 connects the bias pad 82 to a centre pin 84 of a hermetically sealed feed through. The center pin 84 is the power input to control the switching of diodes 88 and 90.

The 50 ohm line 75 ends in two gaps 85, 86 in the metalization. A diode 88 extends across the gap 85 and a diode 90 extends across the gap 86. The diodes 88, 90 are identical to one another and each has a second terminal that is connected to a 50 ohm section of microstripline 92, 94 respectively. The 50 ohm line 92 is terminated in a metal ribbon 96 which connects the line 92 to a center pin 98 of a 50 ohm co-axial transmission line 100. An outer sheet of the co-axial line 100 is attached to the ground 8. The center pin 98 feeds through the dielectric substrate and is level with the microstripline 92. The center pin 98 is the power outlet for the output from the gate terminal 14. A coil 102 is connected to the microstripline 92 between the line 92 and a plated through via-hole 104 that is connected to the ground 8.

The microstripline 94 is terminated in a 50 ohm load 106 through a plated through via-hole 108. A coil 110 is connected between the microstripline 94 and a plated through via-hole 112.

Dielectric material, specifically, a dielectric resonator 114 is mounted on a pedestal 116 of a suitable low loss material, for example, ceramic. The resonator 114 is located along the gate line at a predetermined distance from the gate terminal 14. The low loss ceramic support or pedestal is attached to the substrate by nonconductive adhesive (not shown).

Thus, it can be seen that the transistor 16 has a gate terminal 14 and a drain terminal 22. The output from the drain terminal 22 is the outlet 35 and the output from the gate terminal 14 is the outlet 98. The input 72 is the power inlet for the oscillator.

Figure 3:
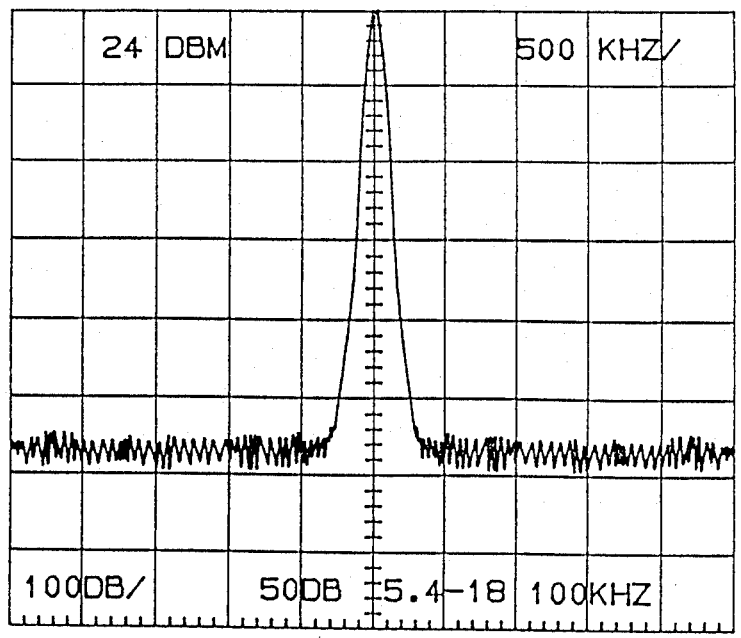
FIG. 3 is a graph showing experimental performance characteristics of the oscillator at a drain port.
Figure 4:
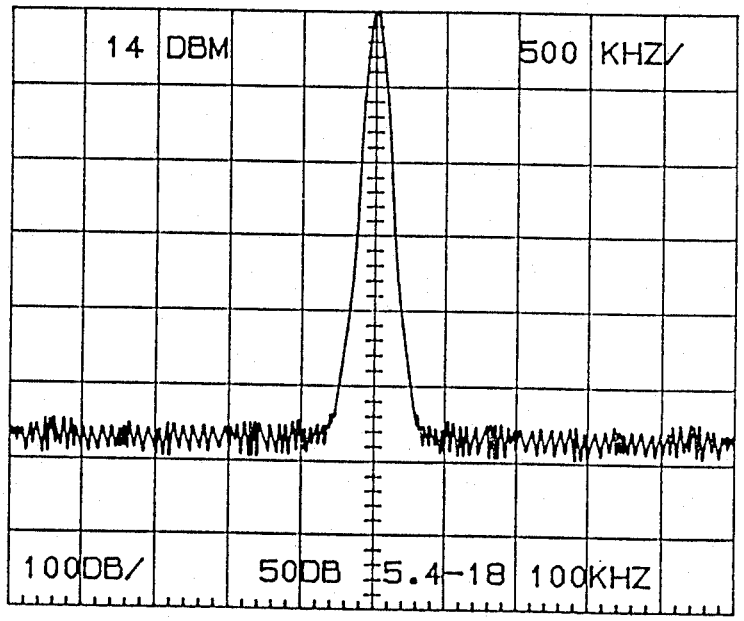
FIG. 4 is a graph showing experimental performance characteristics of the oscillator at a gate port.

In FIGS. 3 and 4, there is shown the performance characteristics of the oscillator 2 for the drain terminal 22 and the gate terminal 14 respectively. It can be seen that the power output from the drain terminal is greater than the power output from the gate terminal.

Figure 5:
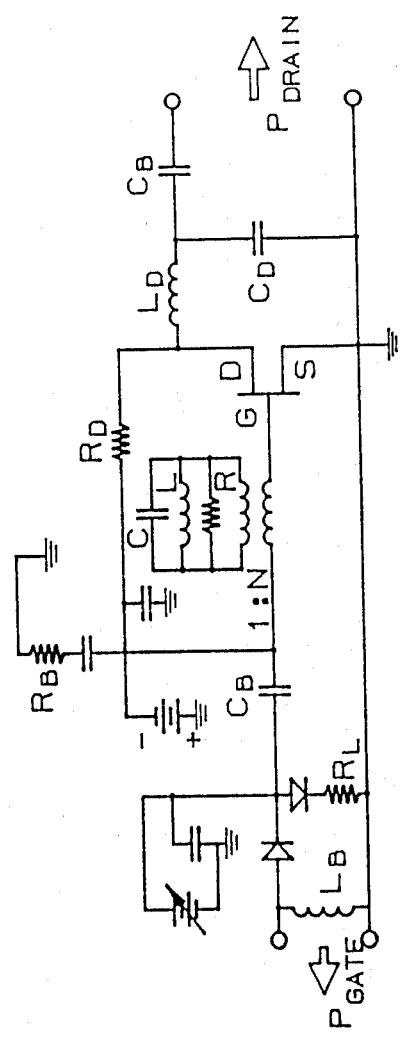
FIG. 5 is one embodiment of a circuit diagram for an oscillator of the present invention.

In FIG. 5, there is shown the equivalent electrical circuit of the oscillator. The dielectric resonator 114 is modelled as a parallel resonant circuit consisting of a capacitor C, inductor L and resistor R. The resonator 114 is coupled to the gate of the FET through a transformer 1:N. The drain of the FET is matched by $L_D$ and $C_D$ with the power taken out through a blocking capacitor $C_B$. The gate of the FET is terminated by two diodes. Depending on the variable supply voltage, the power can be switched into a matching load $R_L$ or taken out at $P_{GATE}$. The constant power supply and the variable power supply bias the FET and the diodes respectively.

In operation, the oscillator 2 is biased by a single negative supply voltage applied through inlet 72 through filter cone 73 and ribbon 71 to bias pad 70. The bias resistor 44 sets up a voltage differential between the gate 14 and the drain 22 of the transistor 16, thus controlling the current through the device. By biasing the transistor 16 with a negative voltage on the drain and a negative voltage on the gate, with the gate voltage being larger than the drain voltage, the conventional current flow in the device is electrically reversed. In turn, the drain 22 becomes a source of electrons and the source 20 effectively becomes the drain. Efficient feedback is generated within the transistor 16 to provide the necessary feedback for use of the device as an oscillator. The Scattering parameters are calculated for this configuration and are used for the oscillator design.

The stability factor K is usually less than 1 in reverse channel configuration for the complete frequency range of GaAs FET. The desired frequency range is the frequency of interest. This satisfies an important requirement of the oscillator circuits.

The open circuit microstrip stub 18 increases the magnitude of $S_{11}$ as computed at the gate 14 of the FET 16. The open circuit microstrip stub 26 and the low impedence transformer 24 are used for matching the output of the FET 16 to a 50 ohm output transmission line, without affecting $S_{11}$. This generates a negative impedance at the gate 14 of the FET 16. Therefore, if the gate 14 is terminated in the conjugate of $S_{11}$ at the desired frequency, an oscillation will build up at that frequency.

The dielectric resonator 114 is used to achieve the desired reflection at the gate 14. The $TE_{01}$ mode of the resonator is magnetically coupled to the microstripline 12. By moving the dielectric resonator perpendicular to the gate line (i.e. the line 12), the coupling and hence the magnitude of the resonance can be controlled. The dielectric resonator height, which is controlled by the height of the support 116 can vary the coupling to the microstripline 12. The phase conjugate of $S_{11}$ can be found by moving the dielectric resonator 114 laterally along the line 12. The circuit oscillates at this point. The output power from the drain 16 is maximized by tuning pads 28. The output capacitor 32 provides a D.C. block and a microwave short circuit to the output pin 35.

Referring to FIG. 1, the metallic plunger 10 can be used to mechanically tune the dielectric resonator as it resonates in the $TE_{01}$ mode. The plunger 10 is adjustable axially and is located in said cover 6 so that it is coaxial with the resonator 114 when the cover is in a closed position on the housing 4. The coupling to the gate line is controlled by the height of the dielectric gate line from the substrate and the perpendicular movement of the dielectric with respect to the gate microstripline 12. Narrow band frequency tuning can be achieved with lateral movement of the dielectric resonator along the gate microstripline 12.

The gate microstripline 12 can be terminated in a single pole double throw (i.e. SPDT) switch, which can be used to terminate the gate line in a 50 ohm load or switch to an output co-axial feed. This switching action can produce a frequency pull on the oscillator 2 which can be controlled at a value under 100 KHz. Once the switch is in a particular position, only variational loading can pull the oscillator frequency.

The drain 22 of the oscillator 2 is matched for maximum power transfer to the load and it does not vary in power level when the gate line is being switched. It can be seen that the metal pattern and transistor of the present invention are biased so that only the dielectric resonator 30 is required to stabilize power over the frequency of interest and both terminals of said transistor can be made to supply microwave power simultaneously, while said dielectric material resonates in a $TE_{01}$ mode.

At the gate 14 the dielectric resonator 114 is reflecting the power back into the FET 16. However, the reflection is not perfect and some of the power funnels out on the gate line 12 through the series blocking capacitor 74 to the diodes 88 and 90. The power can then be switched into the 50 ohm load 106 through diode 90 or it can be taken out through the co-ax feed 100 depending on the voltage potential at microstripline 75.

Since the oscillator 2 is a high power oscillator, the output power at the drain is 22 to 25 dBm and the output power at the gate is usually in the order of 12 to 15 dBm. This is sufficient power for a number of applications without the need of another oscillator.

The electrical distance from the gate 14 of the FET 16 to the plane of the switching diodes 88, 90 must be determined such that when switching is occuring the reflection at this plane will not adversely effect the reflection coefficient of the resonator 114 and change the oscillation frequency.

The magnitude of frequency pulling is also effected by the amount of resonator coupling to the gate line 12. The stronger the coupling to the gate line the less the frequency push. Since the FET 16 will be dominated by the reflection at the resonator 114, the reflection at the switching plane will be small compared to reflection at the resonator. The length of the gate line to the plane of the diodes should be set so that if an open-circuit occurs at the plane of the diodes the reflection back into the FET 16 should fall outside the potential frequency band of oscillation. This will ensure that the FET will not oscillate without the dielectric resonator 114.

The power output from the gate terminal 14 need not be taken out through the switching diodes 88, 90, it can be taken out directly on the 50 ohm microstripline 75 using a co-axial launcher (not shown). To ensure a dielectric resonator controlled resonance, the dielectric resonator coupling to the gate line may need to be increased. In this case, the power levels can be exactly the same as before except the load pull achieved by the gate load may be in the order of a few MHz.

Preferably the capacitors 52, 62, 78 are identical to one another as are the coils 76, 102, 110.

What I claim as my invention is:

1. A dielectrically stabilized planar GaAs FET oscillator comprising a housing containing a metal pattern on a dielectric substrate with backside metalization soldered to a carrier, said housing having a single gate transistor mounted therein, said transistor having a gate terminal and a drain terminal, with dielectric material located on a gate line of said transistor, said metal pattern being formed and said transistor being biased so that only the dielectric material is required to stabilize power at the frequency of interest and both terminals of said transistor can be made to supply microwave power simultaneously, while said dielectric material resonates in a $TE_{01}$ mode, a power supply to the oscillator being a single negative supply voltage, the output power at the drain terminal being greater than that output power at the gate terminal.

2. An oscillator as claimed in claim 1 wherein the ratio of the power output between the drain and gate terminal can be controlled by the movement of the resonator normal to the gate line.

3. An oscillator as claimed in claim 1 wherein the dielectric material is a dielectric resonator and the electromagnetic coupling of said resonator is controlled by a height of the resonator relative to said metal pattern.

4. An oscillator as claimed in claim 3 wherein the resonator is mounted on a dielectric support.

5. An oscillator as claimed in any one of claims 1, 3 or 4 wherein the output power at the drain is maximized.

6. An oscillator as claimed in any one of claims 1, 3 or 4 wherein the gate line is terminated in a single pole double throw switch.

7. An oscillator as claimed in any one of claims 1, 3 or 4 wherein there is a dielectric resonator which is cylindrical in shape and the housing has a removable cover with an adjustable metallic plunger located therein, said plunger being located in said cover so that it is co-axial with the resonator when the cover is in a closed position on said housing.

8. An oscillator as claimed in any one of claims 1, 3 or 4 wherein the output from the gate terminal is removed from the oscillator from beneath the substrate using a co-axial launcher.

9. An oscillator as claimed in any one of claims 1, 3 or 4 wherein the output from the gate terminal is removed from the oscillator without having to pass through a switch.

10. An oscillator as claimed in any one of claims 1, 3 or 4 wherein narrow band frequency tuning can be achieved by lateral movement of the dielectric material along the gate line.

11. An oscillator as claimed in any one of claims 1, 3 or 4 wherein the support for the dielectric material is made from a low loss ceramic material.

* * * * *